US011366152B2

(12) United States Patent
Liu et al.

(10) Patent No.: US 11,366,152 B2
(45) Date of Patent: Jun. 21, 2022

(54) METHOD FOR MEASURING EQUIVALENT CIRCUIT PARAMETERS AND RESONANT FREQUENCY OF PIEZOELECTRIC RESONATOR

(71) Applicant: University of Electronic Science and Technology of China, Chengdu (CN)

(72) Inventors: Dong Liu, Chengdu (CN); Yan Yan, Chengdu (CN); Xiaoting Xiao, Chengdu (CN); Bin Gao, Chengdu (CN); Guiyun Tian, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 476 days.

(21) Appl. No.: 16/666,428

(22) Filed: Oct. 29, 2019

(65) Prior Publication Data
US 2020/0158769 A1   May 21, 2020

(30) Foreign Application Priority Data

Nov. 21, 2018 (CN) .......................... 201811393865.3

(51) Int. Cl.
*G01R 29/22* (2006.01)
*H03H 9/17* (2006.01)
*H03H 9/19* (2006.01)

(52) U.S. Cl.
CPC ............. *G01R 29/22* (2013.01); *H03H 9/176* (2013.01); *H03H 9/19* (2013.01)

(58) Field of Classification Search
CPC .......... G01R 29/22; H03H 9/179; H03H 9/19; H03H 9/02; H03H 9/04; H03H 2003/028; H03H 2003/0414
See application file for complete search history.

(56) References Cited

U.S. PATENT DOCUMENTS 5,444,641 A * 8/1995 White ................... G01R 29/22
702/65
2017/0033840 A1 * 2/2017 Ballandras ........... G01K 11/265

FOREIGN PATENT DOCUMENTS

CN   106199270 A   12/2016

* cited by examiner

*Primary Examiner* — Jeffrey M Shin
(74) *Attorney, Agent, or Firm* — Bayramoglu Law Offices L.L.C

(57) ABSTRACT

A method for measuring equivalent circuit parameters and resonant frequency of a piezoelectric resonator, by which the phase-frequency curve of the piezoelectric resonator is measured, and the resonant frequency and the anti-resonant frequency are obtained. Then, the slopes of the phase-frequency curve at the resonant frequency and the anti-resonant frequency are respectively measured. The resonant angular frequency and the anti-resonant angular frequency are also calculated. Finally, the equivalent circuit parameters of the piezoelectric resonator are obtained by solving a system of nonlinear equations.

4 Claims, 3 Drawing Sheets

(a)  (b)  (c)

METHOD FOR MEASURING EQUIVALENT CIRCUIT PARAMETERS AND RESONANT FREQUENCY OF PIEZOELECTRIC RESONATOR

CROSS REFERENCE TO RELATED APPLICATIONS

This application is based upon and claims priority to Chinese Patent Application No. 201811393865.3, filed on Nov. 21, 2018 the entire contents of which are incorporated herein by reference.

TECHNICAL FIELD

The present invention belongs to the field of electronic technology, and more specifically relates to a method for measuring equivalent circuit parameters and resonant frequency of a piezoelectric resonator.

BACKGROUND

All electrostatically driven piezoelectric resonators may be equivalent to BVD (Butterworth-Van Dyke) models (according to V. E. Bottom, *Introduce to crystal unite design*. York: Van Nostrand Reinhold Company, pp:82, 1987.). A variety of piezoelectric materials, including quartz crystal, lithium tantalate, and piezoelectric ceramic lead zirconate titanate (PZT), can be equivalent to the BVD model. The piezoelectric resonators of some kinds, such as bulk acoustic wave (BAW) resonators, surface acoustic wave (SAW) resonators, quartz crystal microbalance (QCM), etc., can also be equivalent to the BVD model.

There are many methods which can be used to measure the parameters of the BVD equivalent model. For example, CI-miter method, impedance meter, measurement of quartz crystal device parameters by zero phase technology, and measurement of quartz crystal device parameters based on resonant frequency, anti-resonant frequency, load resonant frequency, and load anti-resonant frequency (according to Chinese patent No. CN201610556735.1, entitled *Method For Measuring Equivalent Circuit Parameters Of Quartz Crystal Resonator*, inventors Yang Wang, Hai Yun Shen, Dong Liu), etc.

Instruments for measuring equivalent circuit parameters currently available on the market include impedance meters, vector network analyzers, and the like, such as KH1800/KH1820 manufactured by a Hong Kong Kolinker Industrial Equipments Co. Ltd.

At present, measurement methods based on the IEC60444 standard are mainly used, where the motional resistance are replaced with the resonant resistance. It is reported from the simulations that a more than 20% error exists between the motional resistance and the resonant resistance when the resonator has a low Q value (according to Dong Liu, *Research on Temperature Compensation Technology of Crystal Oscillator [D]. University of Electronic Science and Technology*, 2017.).

The method proposed in the Chinese patent No. CN201610556735.1 (Yang Wang, Hai Yun Shen, Dong Liu, *Method For Measuring equivalent Circuit Parameters Of Quartz Crystal Resonator*, CN201610556735.1), does not have the above error theoretically. However, it has difficulty in practical operations. Therefore, as the frequency drifts with the temperature, a small temperature change would lead to great error in the calculation results. Liu Dong et al. proposed a method for calculating the equivalent parameters based on resonant frequency, anti-resonant frequency, load resonant frequency, load anti-resonant frequency, derivative of phase-frequency curve at the resonant frequency, and derivative of phase-frequency curve at the anti-resonant frequency. (D. Liu, X. H. Huang, J. G. Hu, Y. L. Tang, and Y. Wang, "*Measurement of quartz crystal unit parameters based on the precise derivation of zero phase frequency*" Electronics Letters, vol. 53, p. 2, Feb 2017.). According to the method, the phase-frequency curve of the resonator with and without load capacitance are needed. Therefore, this method requires complicated operations, and it is difficult been integrated in the current scientific instruments as software modules. (e.g. vector network analyzer and impedance meter, etc.).

All the methods described above fail to take the measurement errors of the resonant frequency, the anti-resonant frequency, the load resonant frequency, and the load anti-resonant frequency into account. For example, the measurement accuracy of the resonant frequency measured by the IEC60444-based method is susceptible to the variations of wire length and load. FIG. 1 demonstrates the error in related to the variations of wire length and load. Such an error will be passed to the parameter measurement, thereby affecting the accuracy of the parameter measurement.

SUMMARY

It is therefore an objective of the present invention to overcome the drawbacks of the prior art and provide a method for measuring equivalent circuit parameters and resonant frequency of a piezoelectric resonator without the need of impedance matching or a peripheral circuit such as π-type network or load capacitance, so as to measure the resonant frequency, anti-resonant frequency and equivalent circuit parameters.

To this end, the method for measuring equivalent circuit parameters and resonant frequency of the piezoelectric resonator provided by the present invention includes the following steps:

(1) measuring a phase-frequency curve of the piezoelectric resonator and finding the zero phase point on the phase-frequency curve, namely, obtaining a resonant frequency $f_r$ and an anti-resonant frequency $f_a$;

(2) measuring a slope of the phase-frequency curve at the resonant frequency $f_r$, recording the slope as $\Delta_1$; and measuring a slope of the phase-frequency curve at the anti-resonant frequency $f_a$, recording the slope as $\Delta_2$;

(3) calculating a resonant angular frequency with a formula $\omega_r = 2\pi f_r$, and calculating an anti-resonant angular frequency with a formula $\omega_a = 2\pi f_a$;

(4) substituting $\omega_r$, $\omega_a$, $\Delta_1$, and $\Delta_2$ into the following system of nonlinear equations and solving the nonlinear equations to obtain the equivalent electrical parameters of the piezoelectric resonator: static capacitance $C_0$, motional capacitance $C_1$, motional inductance $L_1$, and motional resistance $R_1$;

$$\begin{cases} \dfrac{\omega_a^2 + \omega_r^2}{2} = \dfrac{1}{L_1 C_1} + \dfrac{1}{2L_1 C_0} - \dfrac{R_1^2}{2L_1^2} \\ \omega_r^2 \omega_a^2 = \dfrac{1}{L_1^2 C_1^2}\left(1 + \dfrac{C_1}{C_0}\right) \\ \left.\dfrac{\partial(Pashe(f) + Phase_{offset})}{\partial f}\right|_{f=f_r} = \Delta_1 \\ \left.\dfrac{\partial(Pashe(f) + Phase_{offset})}{\partial f}\right|_{f=f_a} = \Delta_2 \end{cases}$$

where $\text{Phase}_{offset}$ is a phase offset value, $\text{Pashe}(f)$ is a phase-frequency function, and $f$ is a frequency point on the phase-frequency curve.

The objective of the present invention is realized according to the following processes.

According to the method for measuring the equivalent circuit parameters and the resonant frequency of the piezoelectric resonator provided by the present invention, the resonant frequency and the anti-resonant frequency are obtained by measuring the phase-frequency curve of the piezoelectric resonator; subsequently, the slopes of the phase-frequency curve at the resonant frequency and anti-resonant frequency are respectively measured, and then the resonant angular frequency and the anti-resonant angular frequency are calculated, and last the equivalent circuit parameters of the piezoelectric resonator are obtained by solving the system of the nonlinear equations.

At the same time, the method for measuring the equivalent circuit parameters and the resonant frequency of the piezoelectric resonator according to the present invention has the following advantages:

(1) the present invention neither need additional operations such as impedance matching, instrument zero phase point adjustment, nor peripheral circuit such as the π-type network and the load capacitance; in contrary, only the phase-frequency curve is required to calculate the four equivalent circuit parameters of the piezoelectric resonator;

(2) the accuracy of the resonant frequency measurement is susceptible to the errors induced by the variations of wire length and load; the present invention avoids the influence of the errors, and can directly calculate the zero phase point drift caused by the variations of wire length and load, so that the frequency measurement is more accurate and the frequency measurement error will not be passed to the measurement of parameters;

(3) the calculated parameters highly fit the measured phase-frequency curve, so the parameter measurement accuracy is high;

(4) the R1 measured according to the present invention is not affected by the variation of the Q value of the resonator, so the measurement of the motional resistance R1 is more accurate;

(5) while the present invention does not adopt an approximate model, thus theoretically the motional capacitance C1 is not affected by the M value, and thereby the measurement of the motional capacitance C1 is not affected by the M value of the resonator; and (6) the static capacitance C0 is a capacitance value of a resonant frequency segment, while in the IEC-based method, the measured static capacitance C0 is higher than the capacitance value of the resonant frequency segment. The static capacitance C0 measured with the method according to the present invention is exactly the capacitance value of the resonant frequency segment, thus the capacitance value is more accurate.

DETAILED DESCRIPTION OF THE EMBODIMENTS

The specific embodiments of the present invention will be described hereinafter with reference to the drawings, so that those skilled in the art can better understand the present invention. It should be particularly noted that in the following description, when a detailed description of the well-known functions and designs may downplay the main content of the present invention, these descriptions will be omitted herein.

EMBODIMENT

Figure 2:
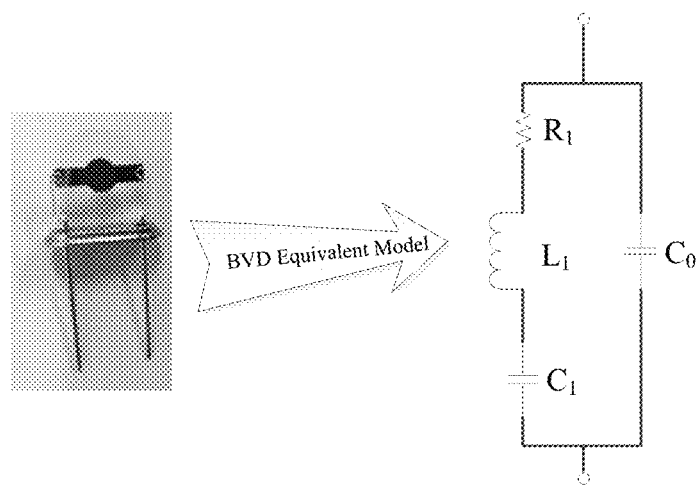
FIG. 2 is a diagram showing a BVD equivalent model of a piezoelectric crystal.

FIG. 2 is a diagram showing a BVD equivalent model of a piezoelectric crystal.

In the present embodiment, the piezoelectric resonator may be a high-Q value crystal piezoelectric resonator, a quartz crystal microbalance piezoelectric resonator, or a microelectromechanical system piezoelectric resonator. As shown in FIG. 2, the piezoelectric crystal is connected to a vector network analyzer to measure S21 characteristics, and the measurement mode is switched to a phase measurement mode. Besides, the piezoelectric resonator may be made of quartz, lithium tantalate, lanthanum gallium silicate, piezoelectric ceramic lead zirconate titanate (PZT), and aluminum nitride (AlN).

The method for measuring equivalent circuit parameters and resonant frequency of a piezoelectric resonator of the present invention includes the following steps:

S1: the phase-frequency curve of the piezoelectric resonator is actually measured through the vector network analyzer and the zero phase point on the phase-frequency curve is found out, i.e., the resonant frequency $f_r$ and the anti-resonant frequency $f_a$ are obtained;

S2: a slope of the phase-frequency curve at the resonant frequency $f_r$ is measured and recorded as $\Delta_1$; and a slope of the phase-frequency curve at the anti-resonant frequency $f_a$ is measured and recorded as $\Delta_2$;

S3: a resonant angular frequency is calculated with a formula $\omega_r = 2\pi f_r$, and an anti-resonant angular frequency is calculated with a formula $\omega_a = 2\pi f_a$; and S4: $\omega_r$, $\omega_a$, $\Delta_1$, and $\Delta_2$ are substituted into the following system of nonlinear equations and the nonlinear equations are solved to obtain the equivalent circuit parameters of the piezoelectric resonator: static capacitance $C_0$, motional capacitance $C_1$, motional inductance $L_1$, and motional resistance $R_1$;

$$\begin{cases} \dfrac{\omega_a^2 + \omega_r^2}{2} = \dfrac{1}{L_1 C_1} + \dfrac{1}{2 L_1 C_0} - \dfrac{R_1^2}{2 L_1^2} \\ \omega_r^2 \omega_a^2 = \dfrac{1}{L_1^2 C_1^2}\left(1 + \dfrac{C_1}{C_0}\right) \\ \dfrac{\partial(\text{Pashe}(f) + \text{Phase}_{offset})}{\partial f}\bigg|_{f=f_r} = \Delta_1 \\ \dfrac{\partial(\text{Pashe}(f) + \text{Phase}_{offset})}{\partial f}\bigg|_{f=f_a} = \Delta_2 \end{cases}$$

where $Phase_{offset}$ is a phase offset value, Pashe($f$) is a phase-frequency function value, and $f$ is a frequency point on the phase-frequency curve.

In the present embodiment, assuming there are N frequency points on the phase-frequency curve, then $f$ may be represented as $f_1, f_2, \ldots, ff_N$;

then the phase-frequency function value Pashe($f_i$) on the $i_{th}$ frequency point meets the following equation:

$$Pashe(f_i) = \frac{180}{\pi} \cdot atan\left(\frac{imag(G(f_i))}{real(G(f_i))}\right)$$

$$\text{where, } G(f_i) = \frac{1}{Z(f_i) + R_0},$$

$Z(f_i)$ is an impedance of the piezoelectric crystal, imag() represents an imaginary part, real( ) represents a real part, and $R_0$ is an internal resistance of the vector network analyzer;

then a phase difference of each frequency point is:

$$\Delta Pashe_i = Pashe(f_i) + Phase_{offset} - Pashe_{measure}(f_i)$$

where $Pashe_{measure}(f_i)$ represents the actual phase value of the $i_{th}$ frequency point $f_i$;

then a root mean square error of the phase differences is calculated as follows:

$$RMSE = \sqrt{\frac{1}{N}\sum_{1}^{N} \Delta Pashe_i}$$

The RMSE is minimized by continuously changing the $Phase_{offset}$, at that time, the calculated equivalent circuit parameters, resonant frequency and anti-resonant frequency are final results.

Figure 3:
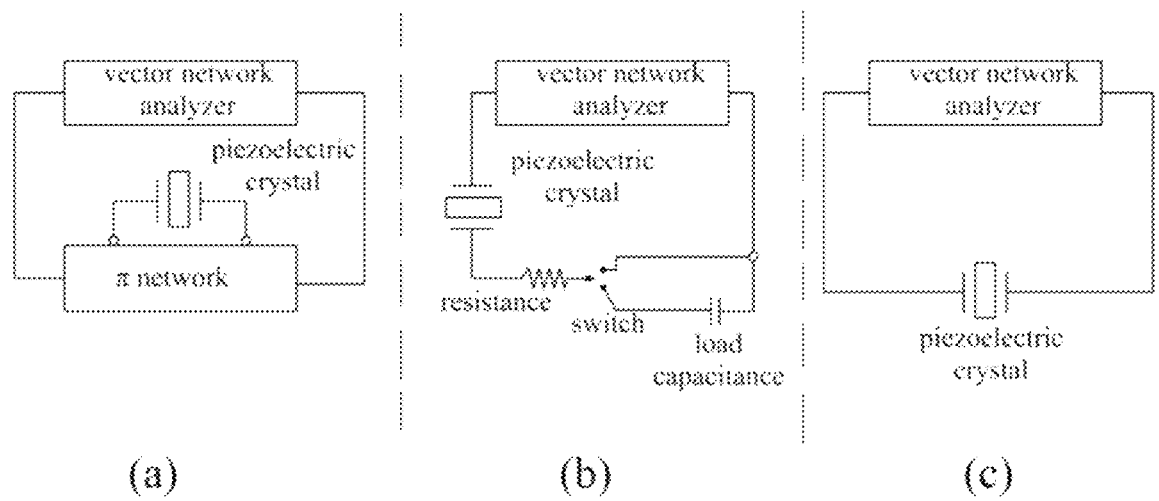
FIG. 3 is a comparison block diagram of three measurement solutions.

FIG. 3 is a comparison block diagram of three measurement solutions.

In the present embodiment, the IEC-based measurement method is shown in FIG. 3(a). The measurement method proposed by Dong Liu in 2017 is shown in FIG. 3(b), and the measurement method of the present invention is shown in FIG. 3(c).

The IEC-based method requires a pi-type network to facilitate impedance matching and has a relatively greater error.

The measurement method proposed by Dong Liu in 2017 requires load capacitance and series resistance, and the measurement error is related to the resistance. This method also needs to switch the state between with and without load-capacitance, which is difficult been integrated in the current scientific instruments as software modules.

The technical solution of the present invention requires no external circuit and no impedance matching, and is directly connected in series to the vector network analyzer. This solution is easy to operate, and has no theoretical error and small measurement error. Simply by measuring four points of the phase-frequency curve, so the resonant frequency, the anti-resonant frequency, and four equivalent circuit parameters can be calculated. The phase-frequency curve inversed from the parameters fits with the actually measured curve at more than 800 points, and the root mean square error of the 800 points is below 0.1107.

Embodiment 1

Figure 4:
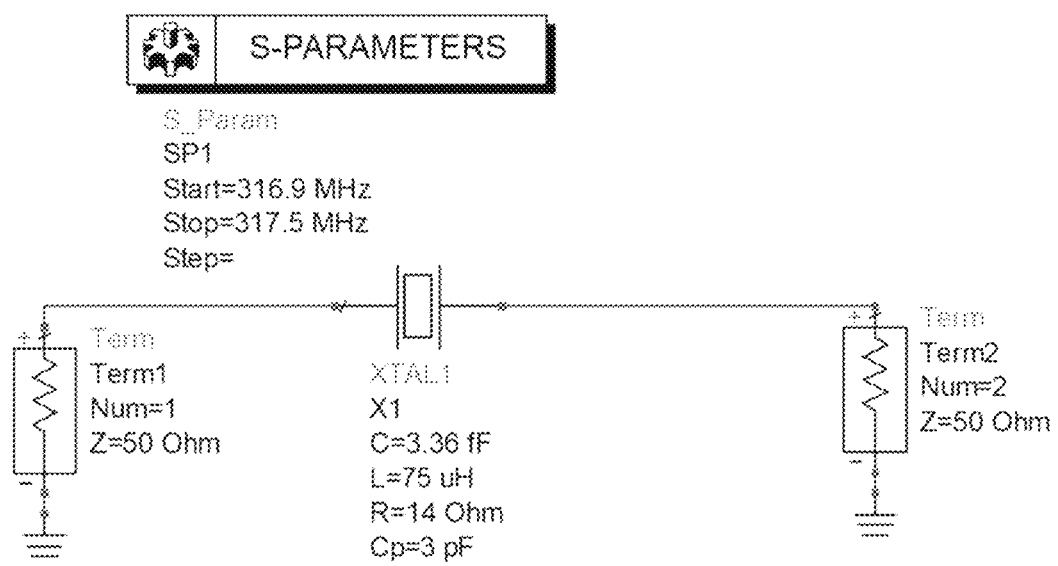
FIG. 4 is a schematic diagram of an ADS software (Advanced Design System) simulation.
Figure 5:
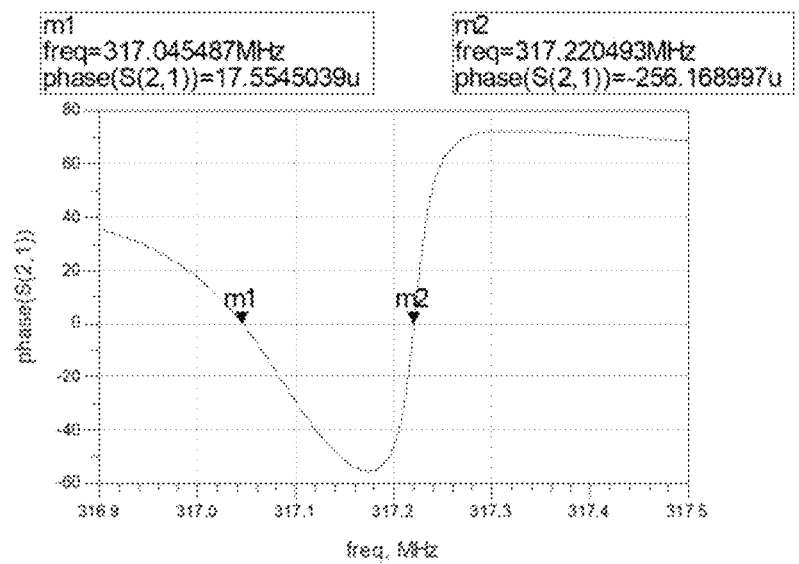
FIG. 5 is a diagram showing a simulation result of the ADS software.

The simulation experiment was carried out with the ADS (Advanced Design System) software. The schematic diagram is shown in FIG. 4. The phase-frequency curve of the simulation is shown in FIG. 5. The results obtained are shown in Table 1.

TABLE 1

|  | $R_1(\Omega)$ | $L_1(mH)$ | $C_1(fF)$ | $C_0(pF)$ |
| --- | --- | --- | --- | --- |
| Set value | 14.0000 | 75.0000 | 3.3600 | 3.0000 |
| Calculated value | 14.0050 | 75.0000 | 3.3600 | 3.0000 |

Embodiment 2

The solution of the embodiment 2 is similar to embodiment 1. With varying set values of the motional resistance $R_1$, the calculated motional resistance $R_1$, which is obtain from the method proposed by the present invention, is shown in Table 2 respectively. The resonant resistance Rr, is also shown in Table 2. The resonant resistance Rr can be obtain from substitution methods similar to IEC.

TABLE 2

| Set value of $R_1$ | $R_r$ calculated by the IEC-based method | $R_1$ calculated by the proposed method |
| --- | --- | --- |
| 14 | 14.0094 | 14.0050 |
| 50 | 55.4998 | 50.0019 |
| 70 | 90.4585 | 70.0037 |

As shown in Table 2, the motional resistance calculated according to the method proposed by the present invention is closer to the set value. The resonant resistance is close to the set value, when the set R1 is small. However, the resonant resistance Rr is different from the motional resistance R1, when the set R1 is bigger.

Embodiment 3

The parameters of a QCM wafer loaded by a drop of water are measured with the vector network analyzer N9913A. The phase-frequency curve measured with the N9913A is shown as a solid line in FIG. 6. According to our nonlinear equations and a MATLAB numerical solution thereof, the obtained equivalent parameters are shown in Table 3.

TABLE 3

| parameter | $R_r(\Omega)$ | $R_1(\Omega)$ | $L_1(mH)$ | $C_1(fF)$ | $C_0(pF)$ |
| --- | --- | --- | --- | --- | --- |
| QCM water load | 380 | 321.8300 | 12.8864 | 20.0005 | 4.2462 |

Figure 6:
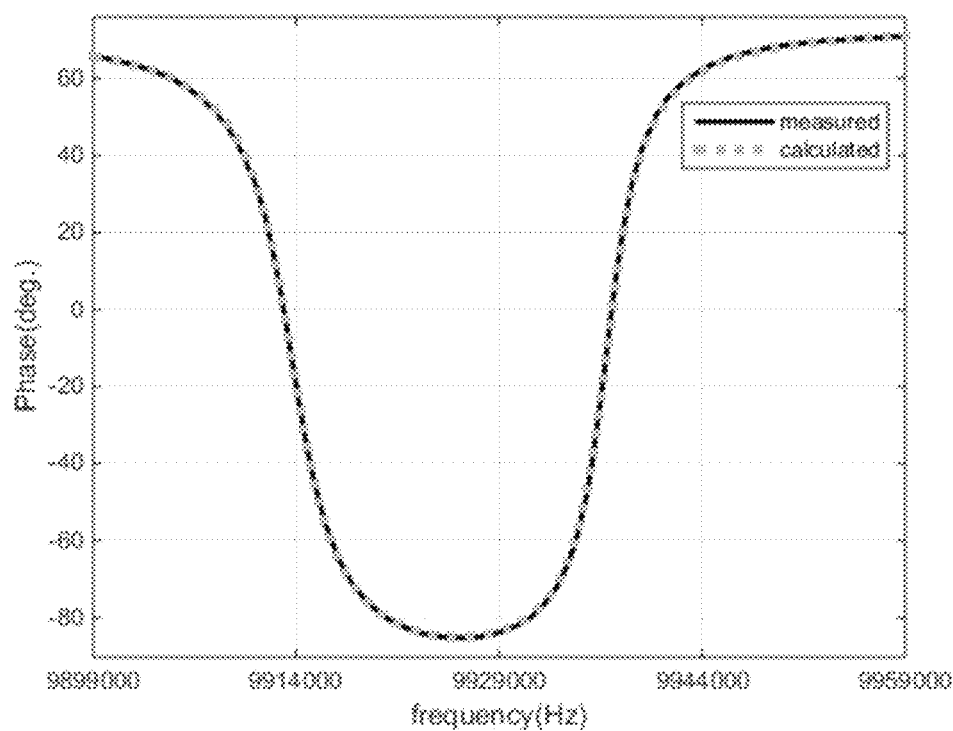
FIG. 6 is a diagram showing an actually measured phase-frequency curve of a QCM (Quartz Crystal Microbalance) subjected to a water load and the phase-frequency curve derived from the calculated parameters.

The phase-frequency curve inverted from the parameters measured by the method of the present invention is shown as a dotted line in FIG. 6, and it can be seen that the inversion curve and the measured curve are almost coincident.

The resonant resistance Rr measured by the substitution method, which is similar to the IEC-based method, is also given in Table 3. It can be concluded that the $R_1$ measured by the method of the present invention is smaller than the Rr which is consistent with the simulation results. Also, it can be concluded from Table 3 that when QCM is loaded with liquid, a large gap exists between Rr and $R_1$.

Embodiment 4

The phase offsets caused by different loads are measured. The phase offsets of the same QCM wafer with no load, water load, or oil load are measured by the method of the present invention and shown in Table 4.

TABLE 4

| QCM load situation | No-load | Water load | Oil load |
|---|---|---|---|
| phase offset value (deg.) | −15.0441 | −15.6539 | −17.0441 |

Figure 1:
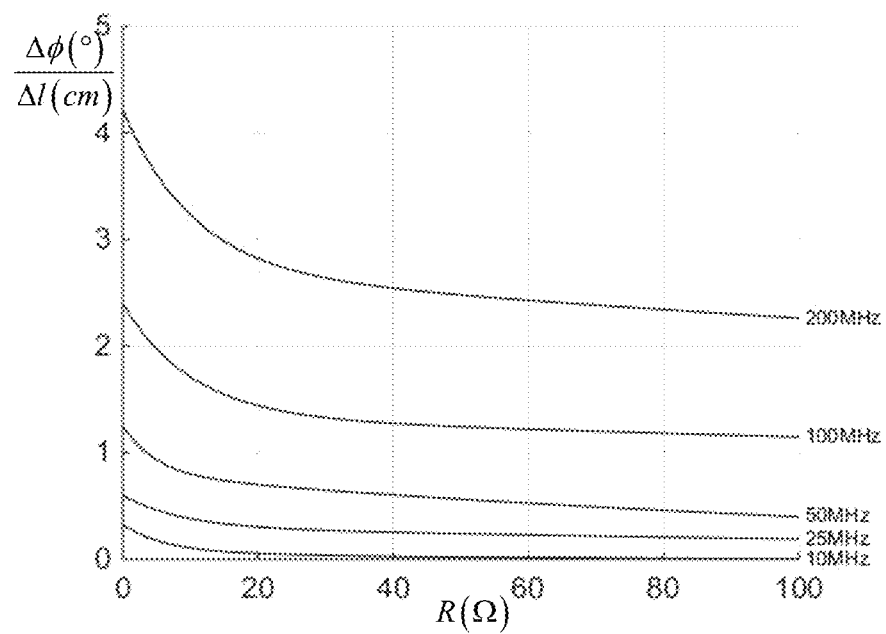
FIG. 1 is a diagram showing a relation between a measurement error of a resonant frequency and variations of wire length and load according to an IEC-based method.

It can be concluded that the present invention can directly measure the zero phase point drifts caused by the variations of load. Therefore, the present invention does not have the measurement errors caused by the variations of load as shown in FIG. 1.

Embodiment 5

The phase offsets caused by different wire lengths are measured. Two quartz crystals with brackets of different lengths are numbered as 1# and 2#, respectively. The phase offsets measured by the method of the present invention are shown in Table 5.

TABLE 5

| Crystal number | Crystal 1# | Crystal 2# |
|---|---|---|
| phase offset value (deg.) | −45.0005 | −35.1400 |

It can be concluded that the method of the present invention can directly measure the phase offset caused by the variations of load or the wire length without introducing the measurement errors caused by the variations of load and the wire length as shown in FIG. 1.

The specific embodiments of the present invention are described above to facilitate the understanding of those skilled in the art. It should be noted, however, that the present invention is not limited to the scope of the specific embodiments. As for those of ordinary skill in the art, as long as the various variations fall within the spirit and scope of the present invention as defined and determined by the appended claims, these variations are obvious. All inventions derived from the idea of the present invention are covered by the present invention.

What is claimed is:

1. A method for measuring equivalent circuit parameters and a resonant frequency of a piezoelectric resonator comprising:

measuring a phase-frequency curve of the piezoelectric resonator and finding a zero phase point on the phase-frequency curve, namely, obtaining the resonant frequency $f_r$ and an anti-resonant frequency $f_a$;

measuring a slope of the phase-frequency curve at the resonant frequency $f_r$, recording the slope as $\Delta_1$; and measuring a slope of the phase-frequency curve at the anti-resonant frequency $f_a$, recording the slope as $\Delta_2$;

calculating a resonant angular frequency with a formula $\omega_r = 2\pi f_r$, and calculating an anti-resonant angular frequency with a formula $\omega_a = 2\pi f_a$; and substituting $\omega_r$, $\omega_a$, $\Delta_1$, and $\Delta_2$ into the following system of nonlinear equations and solving the nonlinear equations to obtain the equivalent circuit parameters of the piezoelectric resonator including a static capacitance $C_0$, a motional capacitance $C_1$, a motional inductance $L_1$, and a motional resistance $R_1$;

$$\begin{cases} \dfrac{\omega_a^2 + \omega_r^2}{2} = \dfrac{1}{L_1 C_1} + \dfrac{1}{2 L_1 C_0} - \dfrac{R_1^2}{2 L_1^2} \\ \omega_r^2 \omega_a^2 = \dfrac{1}{L_1^2 C_1^2}\left(1 + \dfrac{C_1}{C_0}\right) \\ \dfrac{\partial(Pashe(f) + Phase_{offset})}{\partial f}\bigg|_{f=f_r} = \Delta_1 \\ \dfrac{\partial(Pashe(f) + Phase_{offset})}{\partial f}\bigg|_{f=f_a} = \Delta_2 \end{cases}$$

wherein $Phase_{offset}$ is a phase offset value, $Pashe(f)$ is a phase-frequency function, and $f$ is a frequency point on the phase-frequency curve.

2. The method for measuring the equivalent circuit parameters and the resonant frequency of the piezoelectric resonator according to claim 1, wherein the $Pashe(f)$ meets the following formula:

$$Pashe(f) = \frac{180}{\pi} \cdot \arctan\left(\frac{\mathrm{imag}(G(f))}{\mathrm{real}(G(f))}\right)$$

$$\text{where, } G(f) = \frac{1}{Z(f) + R_0},$$

$Z(f)$ is an impedance of a piezoelectric crystal, and $R_0$ is an internal resistance of a vector network analyzer.

3. The method for measuring the equivalent circuit parameters and the resonant frequency of the piezoelectric resonator according to claim 1, wherein the piezoelectric resonator comprises a high-Q value crystal piezoelectric resonator, a quartz crystal microbalance piezoelectric resonator, and a microelectromechanical system piezoelectric resonator.

4. The method for measuring the equivalent circuit parameters and the resonant frequency of the piezoelectric resonator according to claim 1, wherein the piezoelectric resonator is made of quartz, lithium tantalate, lanthanum gallium silicate, piezoelectric ceramic lead zirconate titanate (PZT), or aluminum nitride (AlN).

* * * * *